(12) United States Patent
Su et al.

(10) Patent No.: US 12,230,184 B2
(45) Date of Patent: Feb. 18, 2025

(54) DISPLAY MODULE HAVING LOW DIFFERENCE IN PIXEL LUMINANCE AND DISPLAY APPARATUS

(71) Applicants: Beijing BOE Display Technology Co., Ltd., Beijing (CN); BOE Technology Group Co., Ltd., Beijing (CN)

(72) Inventors: Qiujie Su, Beijing (CN); Yingmeng Miao, Beijing (CN); Dongchuan Chen, Beijing (CN); Yanping Liao, Beijing (CN); Seungmin Lee, Beijing (CN); Xibin Shao, Beijing (CN); Xiaofeng Yin, Beijing (CN)

(73) Assignees: Beijing BOE Display Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/634,733

(22) PCT Filed: Mar. 29, 2021

(86) PCT No.: PCT/CN2021/083618
§ 371 (c)(1),
(2) Date: Feb. 11, 2022

(87) PCT Pub. No.: WO2022/204877
PCT Pub. Date: Oct. 6, 2022

(65) Prior Publication Data
US 2023/0377506 A1    Nov. 23, 2023

(51) Int. Cl.
*G09G 3/20* (2006.01)
*G06F 3/041* (2006.01)

(52) U.S. Cl.
CPC ......... *G09G 3/2096* (2013.01); *G06F 3/0412* (2013.01); *G06F 3/0416* (2013.01);
(Continued)

(58) Field of Classification Search
CPC .................................................. G09G 3/2096
See application file for complete search history.

(56) References Cited

U.S. PATENT DOCUMENTS 9,448,665 B2 * 9/2016 Lee .......................... G06F 3/042
2008/0100556 A1 5/2008 Tseng
(Continued)

FOREIGN PATENT DOCUMENTS

| CN | 101017258 A | 8/2007 |
|---|---|---|
| CN | 103956132 A | 7/2014 |

(Continued)

*Primary Examiner* — William Boddie
*Assistant Examiner* — Andrew B Schnirel
(74) *Attorney, Agent, or Firm* — IPro, PLLC

(57) ABSTRACT

At least one chip group and a group of first PLG wirings corresponding to each of the chip groups are disposed in a first bonding area, each of the chip groups includes at least two groups of chip units, each group of the chip units includes at least one gate drive chip, each group of the first PLG wirings includes a first wiring and at least one second wiring; power pins of any two adjacent gate drive chips are connected by the first wiring, each of the second wirings surrounds and passes through each of the gate drive chips, the first wirings connected with the power pin of the last gate drive chip in the previous group of the chip units and any of the second wirings, are parallelly connected with the power pin of the first gate drive chip in the next group of the chip units.

15 Claims, 11 Drawing Sheets

(52) U.S. Cl.
CPC ............. *G09G 2310/0267* (2013.01); *G09G 2310/0275* (2013.01)

(56) References Cited

U.S. PATENT DOCUMENTS

| | | | | |
|---|---|---|---|---|
| 2014/0139413 | A1* | 5/2014 | Kwon | .................... H10K 59/88 |
| | | | | 345/82 |
| 2015/0310823 | A1 | 10/2015 | Wang | |
| 2018/0033392 | A1 | 2/2018 | Xie | |
| 2019/0064979 | A1* | 2/2019 | Liu | ........................ G06F 3/047 |

FOREIGN PATENT DOCUMENTS

| | | |
|---|---|---|
| CN | 105242466 A | 1/2016 |
| CN | 105427823 A | 3/2016 |
| CN | 109491121 A | 3/2019 |

* cited by examiner

FIG. 10

DISPLAY MODULE HAVING LOW DIFFERENCE IN PIXEL LUMINANCE AND DISPLAY APPARATUS

TECHNICAL FIELD

This application relates to the field of display technology, in particular to a display module and a display apparatus.

BACKGROUND

In the display apparatus, by considering the problems of narrow borders of the display panel and the cost reduction, the gate drive chip is not provided with a separate printed circuit board (PCB), but propel link gate (PLG) wirings are disposed in the display panel. The input end of the PLG wirings is connected with the power signal end of the data pad (DP), and the power signal input by the power signal end is provided to each gate drive chip through the PLG wirings.

SUMMARY

Some embodiments of the disclosure provide the following technical solutions:

for the first aspect, a display module is provided, and comprises: a display panel, the display panel comprises an active area and a non-active area surrounding the active area, the non-active area comprises a first bonding area located at at least one side of two opposite sides of the active area;

the first bonding area at each side is provided with at least one chip group, and a group of first PLG wirings corresponding to each of the chip groups; each of the chip groups comprises at least two groups of chip units, each group of the chip units comprise at least one gate drive chip; each group of the first PLG wirings comprises a first wiring and at least one second wiring, and input ends of the first wiring and each of the second wirings are connected with the same power signal end;

wherein, power pins of any two adjacent instances of the gate drive chips are connected by the first wiring, and each of the second wirings surrounds and passes through each of the gate drive chips; from a direction close to the power signal end to a direction far away from the power signal end, the first wiring connected with the power pin of the last gate drive chip in the previous group of the chip units and any of the second wirings are parallelly connected with the power pin of the first gate drive chip in the next group of the chip units.

For the second aspect, a display apparatus is provided, which comprises the display module as mentioned above.

The above description is only an overview of the technical scheme of the disclosure. In order to better understand the technical means of the disclosure, the implementation may be carried out in accordance with the contents of the manual, and in order to make the aforesaid and other purposes, features and advantages of the disclosure more obvious and understandable, the specific implementation methods of the disclosure are given below.

BRIEF DESCRIPTION OF THE DRAWINGS

In order to more clearly illustrate the technical solutions of the embodiments of the present application or the prior art, the figures that are required to describe the embodiments or the prior art will be briefly introduced below. Apparently, the figures that are described below are embodiments of the present application, and a person skilled in the art may obtain other figures according to these figures without paying creative work.

FIG. 10 illustrates a schematic diagram of the distribution of pins of the first touch display drive chips;

DETAILED DESCRIPTION OF THE EMBODIMENTS

In order to make the objects, the technical solutions and the advantages of the embodiments of the present disclosure clearer, the technical solutions of the embodiments of the present disclosure will be clearly and completely described below with reference to the drawings of the embodiments of the present disclosure. Apparently, the described embodiments are merely certain embodiments of the present disclosure, rather than all of the embodiments. All of the other embodiments that a person skilled in the art obtains on the basis of the embodiments of the present disclosure without paying creative work fall within the protection scope of the present disclosure.

In related art, a PLG wiring only includes one wiring, and the input end of the PLG wiring is connected with the power signal end of the DP side, the power signals input by the power signal end are provided to each gate drive chip in sequence through the PLG wiring.

Due to the existed resistance of the PLG wiring, there is a large voltage drop of the PLG wiring from the input end to the far-end, so that the power signals provided by the PLG wiring will be attenuated. In a large scale display panel, distances between each gate drive chip and the power signal end are different, so the lengths of the PLG wiring used in the connection between each gate drive chip and the power signal end are different. Therefore, the voltage values of the power signals provided to each gate drive chip by the PLG wiring are different, the power signals are low-level power signals VGL; moreover, the voltage values of the power signals may affect gate low-level signals output by the gate drive chips, and the gate low-level signals may affect the luminance of pixels in an active area. Therefore, when the voltage values of the power signals provided to each gate drive chip are different, the luminance of the pixels driven by each gate drive chip may be different, so that horizontal grains may occur.

Therefore, this disclosure divides chip groups into at least two groups of chip units, and the first wiring connected with the power pin of the last gate drive chip in the previous group of the chip units and any of the second wirings are parallelly connected with the power pin of the first gate drive chip in the next group of the chip units, it makes the wiring resistances between each gate drive chip of each group of the chip units more balanced, therefore, the differences of the voltage values of the power signals provided to each gate drive chip of each group of the chip units are reduced, and the differences of the luminance of the pixels driven by each of the gate drive chips of each group of the chip units are reduced correspondingly, so as to reduce the display horizontal grains of the display panel.

Figure 1:
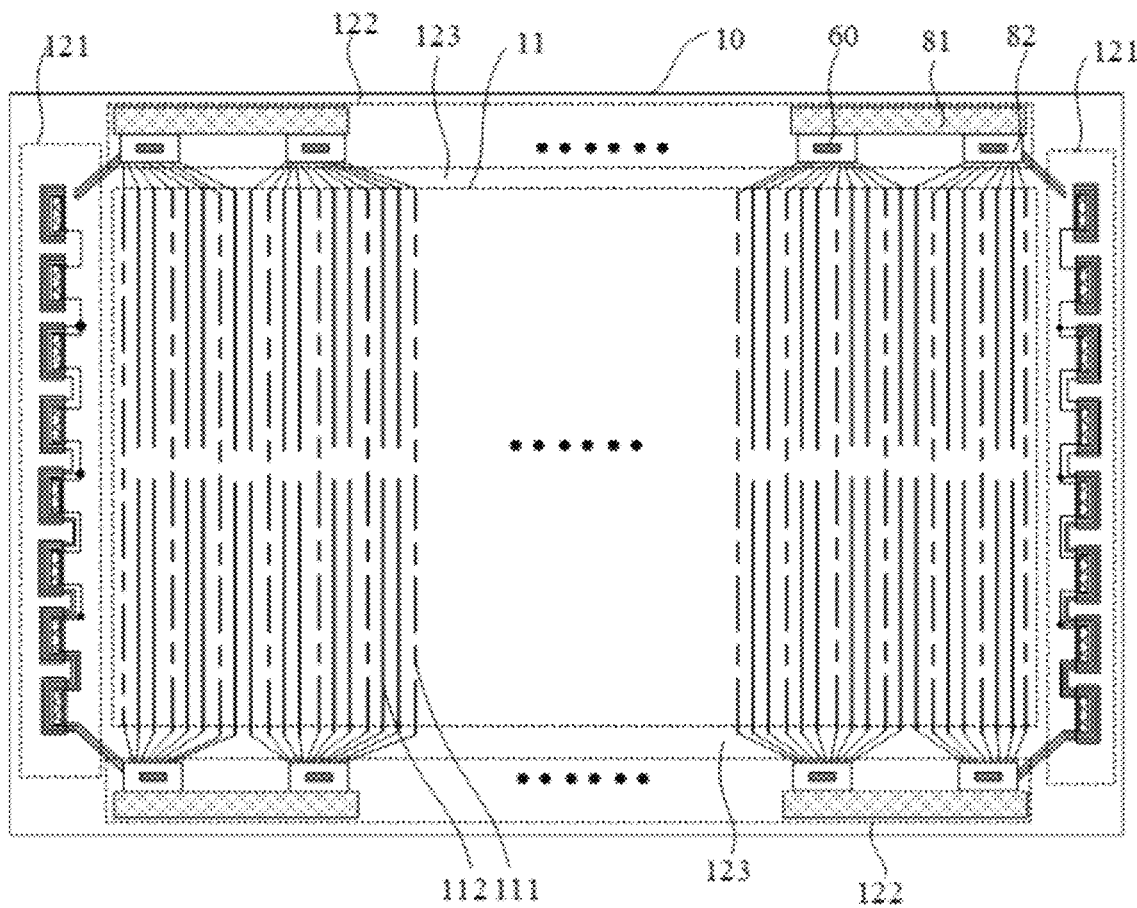
FIG. 1 illustrates a structural schematic diagram of a display module for an embodiment of the disclosure.
Figure 2:
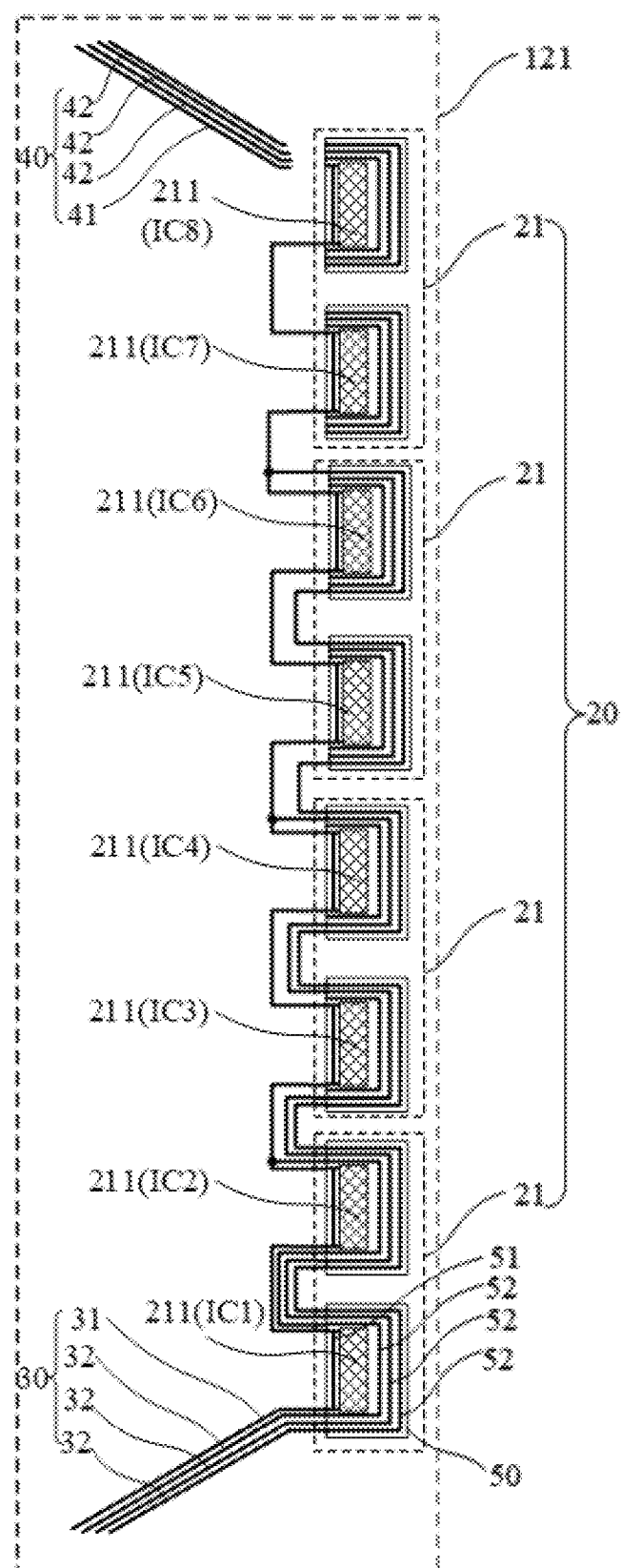
FIG. 2 illustrates a schematic diagram of the connection between the first gate drive chips and the first PLG wirings.
Figure 3:
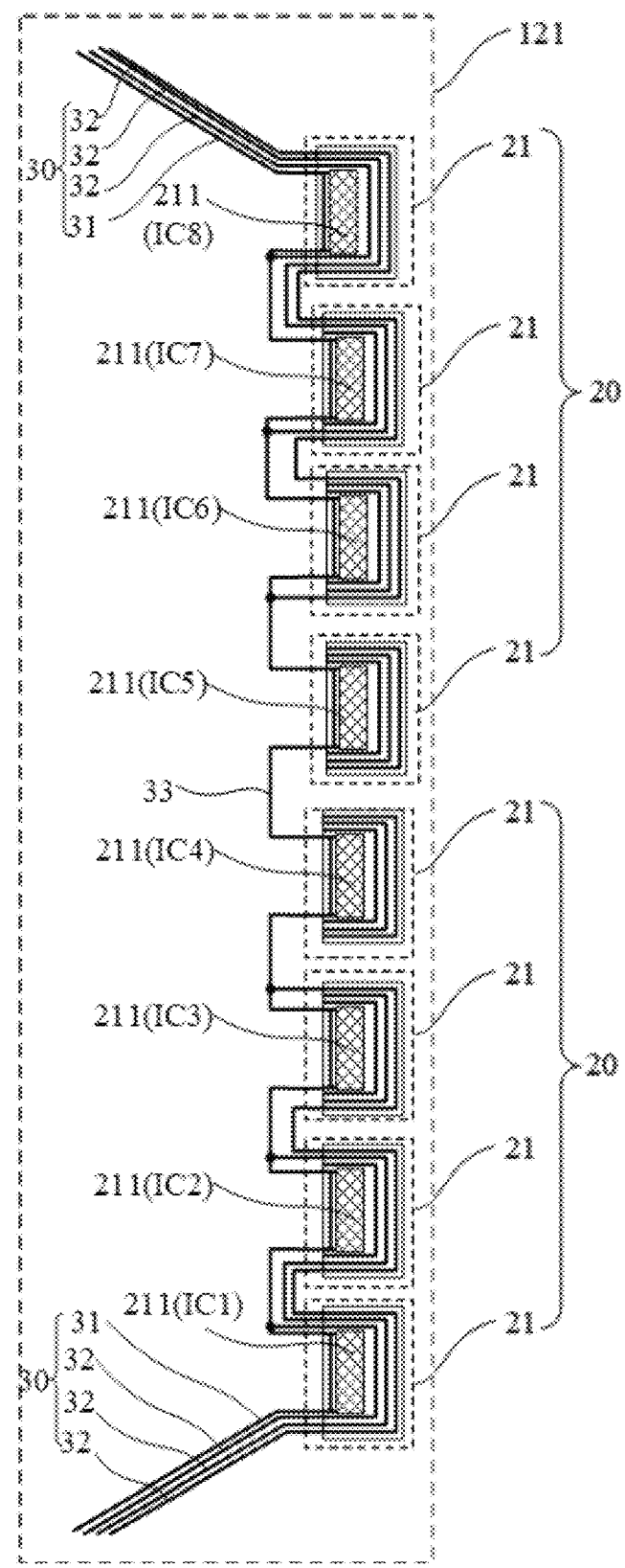
FIG. 3 illustrates a schematic diagram of the connection between the second gate drive chips and the first PLG wirings.
Figure 4:
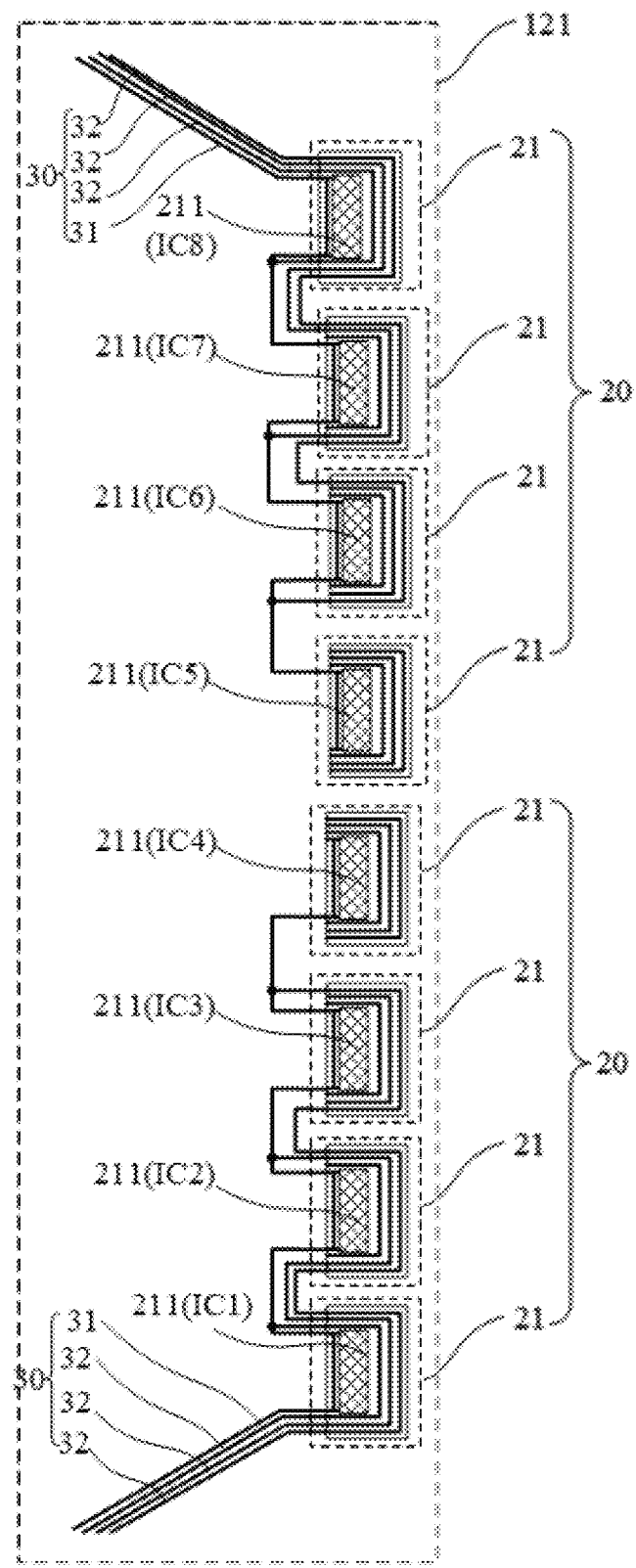
FIG. 4 illustrates a schematic diagram of the connection between the third gate drive chips and the first PLG wirings.

As referred to FIG. 1, which illustrates a structural schematic diagram of a display module for this embodiment of the disclosure. FIG. 2 illustrates a schematic diagram of the connection between the first gate drive chips and the first PLG wirings. FIG. 3 illustrates a schematic diagram of the connection between the second gate drive chips and the first PLG wirings. FIG. 4 illustrates a schematic diagram of the connection between the third gate drive chips and the first PLG wirings.

This embodiment of the disclosure provides a display module, as referred to FIG. 1, the display module includes: a display panel 10, the display panel 10 includes an active area 11 and a non-active area surrounds the active area 11, the non-active area includes a first bonding area 121 which is located at at least one side of the two opposite sides of the active area 11.

As shown in FIG. 2 to FIG. 4, at least one chip group 20 and a group of the first PLG wirings 30 corresponding to each of the chip groups 20 are disposed in the first bonding area 121 on each side; each of the chip groups 20 includes at least two groups of chip units 21, each group of the chip units 21 includes at least one gate drive chip 211; each group of the first PLG wirings include the first wiring 31 and at least one second wiring 32, the input ends of the first wiring 31 and each of the second wirings 32 are connected with the same power signal end; wherein, the power pins of any two adjacent gate drive chips 211 are connected through the first wiring 31, each of the second wirings 32 surrounds and passes through each of the gate drive chips 211; moreover, from the direction close to the power signal end to the direction far away from the power signal end, the first wiring 31 connected with the power pin of the last gate drive chip 211 in the previous group of the chip units 21 and any of the second wirings 32 are parallelly connected with the power pin of the first gate drive chip 211 in the next group of the chip units 21.

In practical products, the display panel 10 includes the active area 11 and the non-active area surrounds the active area 11. A plurality of pixel units are disposed in the active area 11, each of the pixel units includes a plurality of sub-pixels. The non-active area includes the first bonding area 121 which is located at at least one side of the two opposite sides of the active area 11. As shown in FIG. 1, the non-active area includes two first bonding areas 121, the two first bonding areas 121 are respectively located at the two opposite sides of the active area 11, the two first bonding areas 121 are actually located at the GP side and the GPO side of the active area 1, the GP side refers to the Gate Pad side, which is the side of the gate lines crimping area (as shown in the left side of FIG. 1), the GPO side refers to the Gate Pad Opposite side, which is the opposite side of the gate lines crimping area (as shown in the right side of FIG. 1). It is certain that the non-active area may also only include the first bonding area 121 located at either side of the two opposite sides of the active area 11, that is, the first bonding area 121 may be located at the GP side or the GPO side of the active area 11.

For each of the first bonding areas 121, at least one chip group 20 and a group of the first PLG wirings 30 corresponding to each of the chip groups 20 are disposed in each of the first bonding area 121, that is, the chip group 20 corresponds to the first PLG wiring 30 one by one. Each chip group 20 includes at least two groups of the chip units 21, each group of the chip units 21 includes at least one gate drive chip 211. As shown in FIG. 2, a chip group 20 and a group of the first PLG wirings 30 are disposed in each of the first bonding area 121, each of the chip groups 20 includes 4 groups of the chip units 21, each of the chip units 21 comprise 2 gate drive chips 211. As shown in FIG. 3 and FIG. 4, two chip groups 20 and two groups of the first PLG wirings 30 are disposed in each of the first bonding area 121, each of the chip groups 20 includes 4 groups of the chip units 21, each group of the chip units 21 includes 1 gate drive chip 211.

Each group of the first PLG wirings 30 includes the first wiring 31 and at least one second wiring 32. As shown in FIG. 2 to FIG. 4, each group of the first PLG wirings 30 includes 1 first wiring 31 and 3 second wirings 32. The input ends of the first wiring 31 and each of the second wirings 32 are connected with the same power signal end, the power signal end refers to a low-level power signal end, and both of the first wiring 31 and the second wirings 32 extend to the direction away from the power signal end.

Wherein the power pins of any two adjacent gate drive chips 211 are connected through the first wiring 31, the power pins of the gate drive chips 211 refer to the low-level power pins, the low-level power signal end inputs low-level power signals VGL to the low-level power pins of each of the gate drive chips 211 through the first wiring 31; while each of the second wirings 32 surrounds and passes through each of the gate drive chips 211, that is, there is no connecting relationship between each of the second wirings 32 and each of the gate drive chips 211.

Moreover, from the direction close to the power signal end to the direction far away from the power signal end, the first wiring 31 connected with the power pin of the last gate drive chip 211 in the previous group of the chip units 21 and any of the second wirings 32 are parallelly connected with the power pin of the first gate drive chip 211 in the next group of the chip units 21.

In related art, due to the existed voltage drop of the first PLG wirings from the direction close to the power signal end to the direction far away from the power signal end, the differences of the voltage values of the power signals provided to each of the gate drive chips are large, so that the problem of displaying horizontal grains may happen. Therefore, when the first wiring 31 connected with the previous group of the chip units 21 and any of the second wirings 32 are parallelly connected with the next group of the chip units 21, it makes the wiring resistances between each of the gate drive chips 211 of each group of the chip units 21 more balanced, therefore, the differences of the voltage values of the power signals provided to each of the gate drive chips 211 of each group of the chip units 21 are reduced, and the differences of the luminance of the pixels driven by each of the gate drive chips 211 of each group of the chip units 21 are reduced correspondingly, so as to reduce the display horizontal grains of the display panel 10.

It should be noted that the above mentioned first PLG wirings 30 only refer to the PLG wirings transmitting the low-level power signal VGL. In practical products, there are other PLG wirings connected with the gate drive chips 211 in the first bonding area 121, such as the PLG wirings for transmitting timing control signals. However, the voltage drop of these PLG wirings may not affect the luminance of the pixels, therefore, these PLG wirings only include one wiring, and each of the gate drive chips 211 is connected in series. Only the first PLG wirings 30 in this embodiment of the disclosure needs to include one first wiring 21 and at least one of the second wirings 32, and the first wiring 31 connected with the power pin of the last gate drive chip 211 in the previous group of the chip units 21 and any of the second wirings 32 are parallelly connected with the power pin of the first gate drive chip 211 in the next group of the chip units 21, so as to reduce the resistance of the first wiring 31 after parallelly connected.

In practical products, the gate drive chips 211 are connected with the gate lines which are connected with each row of sub-pixels in the active area 11, to provide gate signals to the gate lines. When the non-active area includes the first bonding areas 121 located at the two opposite sides of the active area 11, and the gate drive chip 211 is disposed in each of the first bonding areas 121, the same gate line is respectively connected with the gate drive chips 211 located in two first bonding areas 121, that is, through the gate drive chips 211 located in two first bonding areas 121, realizing bilateral drive to the same gate line.

In addition, the materials of the first PLG wirings 30 and a gate layer in the active area 11 are the same and formed by the same composition process at the same time. The gate layer in the active area 11 includes gate lines and gates of transistors and so forth.

As an optional embodiment of this disclosure, as shown in FIG. 1 and FIG. 2, a chip group 20 and a group of the first PLG wirings 30 are disposed in the first bonding area 121 on each side. The non-active area further includes a second bonding area 122 located at either side of the two opposite sides of the active area 11, the side where the second bonding area 122 located at is adjacent to the side where the first bonding area 121 located at, and the power signal end connected with the first PLG wirings 30 is located at the second bonding area 122.

At this time, the non-active area includes the second bonding area 122 located at either side of the two opposite sides of the active area 11, the second bonding area 122 may located at either the DP side or the DPO side of the active area 11, the DP side refers to the Data Pad side, which is the side of the data lines crimping area (as shown in the downward side of FIG. 1), the DPO side refers to the Data Pad side, which is the opposite side of the data lines crimping area (as shown in the upward side of FIG. 1).

Specifically, the second bonding area 122 of the DP side or the second bonding area 122 of the DPO side is provided with a PCB, the first PLG wirings 30 is connected with the PCB through golden fingers, that is, the power signal end connected with the first PLG wirings 30 is provided through the PCB disposed in the second bonding area 122.

The embodiment takes a large scale display panel with resolution of 3840*2160 as an example, to introduce the connecting connection between the gate drive chips 211 and the first PLG wirings 30. At this time, the power signal end connected with the first PLG wirings 30 is located at the DP side of the second bonding area 122.

Generally, the quantity of channels of the gate drive chips 211 which may be capable of driving the ultra-large scale display panel is less than or equal to 270, as to drive the display panel with a resolution 3840*2160, it needs 16 gate drive chips 211. 8 gate drive chips 211 are disposed in the first bonding area 121 of each side, and each of the gate drive chips 211 may be capable of driving 270 gate lines. Therefore, each chip group 20 is divided into 4 groups of chip units 21, each of the chip units 21 includes 2 gate drive chips 211. Each of the first PLG wirings includes 1 first wiring 31 and 3 second wirings 32.

These three second wirings 32 are sequentially called VGL wiring 1. VGL wiring 2 and VGL wiring 3, and the VOL wiring 3 is one of the second wirings 32 which is closest to the first wiring 31, the VGL wiring 1 is one of the second wirings 32 which is farthest to the first wiring 31, the VGL wiring 2 is located between the VGL wiring 1 and the VGL wiring 3. Moreover, from the direction of the DP side pointed to the DPO side, the eight gate drive chips 211 are a gate drive chip 1 (IC1), a gird drive chip 2 (IC2), a gate drive chip 3 (IC3), a gate drive chip 4 (IC4), a gate drive chip 5 (IC5), a gate drive chip 6 (IC6), a gate drive chip 7 (IC7) and a gate drive chip 8 (IC8), respectively. The gate drive chip 1 and the gate drive chip 2 are a group of chip units 21, the gate drive chip 3 and gate drive chip 4 are a group of chip units 21, the gate drive chip 5 and the gate drive chip 6 are a group of chip units 21, and the gate drive chip 7 and the gate drive chip 8 are a group of chip units 21.

The input ends of the first wiring 31, the VGL wiring 1, the VGL wiring 2 and the VGL wiring 3 are all connected with the same power signal end, and the first wiring 31 is also connected with the power pin of the gate drive chip 1. The gate drive chip 1 is driven by the power signals provided by the first wiring 31, while the VGL wiring 1, VGL wiring 2 and VGL wiring 3 are all surround then pass through the gate drive chip 1, which are not connected with the power pin of the gate drive chip 1. Then, after passing through the gate drive chip 1, the first wiring 31, the VGL wiring 1, the VGL wiring 2 and the VGL wiring 3 reach the position of the gate drive chip 2 after passing through a certain distance. The first wiring 31 continues to connect with the power pin of the gate drive chip 2. The gate drive chip 2 is driven by the power signals provided by the first wiring 31, while the VGL wiring 1, the VGL wiring 2 and the VGL wiring 3 continue to surround and then pass through the gate drive chip 2.

After the first wiring 31, the VGL wiring 1, the VGL wiring 2 and the VGL wiring 3 pass through the gate drive chip 2, the VGL wiring 3 is parallelly connected with the first wiring 31 to form a first wiring 31 after the first parallel connection. At this time, the first PLG wirings remains only three wirings, the first wiring 31 after the first parallel connection, the VGL wiring 1 and the VGL wiring 2 reach the position of the gate drive chip 3 after a certain distance, and the first wiring 31 after the first parallel connection is connected with the power pin of the gate drive chip 3, the gate drive chip 3 is driven by the power signals provided by the first wiring 31 after the first parallel connection, while the VGL wiring 1 and the VGL wiring 2 surround and then pass through the gate drive chip 3. Then, after passing through the gate drive chip 3, the first wiring 31 after the first parallel connection, the VGL wiring 1 and the VGL wiring 2 reach the position of the gate drive chip 4 after a certain distance. The first wiring 31 after the first parallel connection continues to connect with the power pin of the gate drive chip 4. The gate drive chip 4 is driven by the power signals provided by the first wiring 31 after the first parallel connection, while the VGL wiring 1 and the VGL wiring 2 continue to surround and then pass through the gate drive chip 4.

After the first wiring 31 after the first parallel connection, the VGL wiring 1 and the VGL wiring 2 pass through the gate drive chip 4, the VGL wiring 2 is parallelly connected with the first wiring 31 after the first parallel connection again, to form a first wiring 31 after the second parallel connection. At this time, the first PLG wirings 30 remains only 2 wirings, the first wiring 31 after the second parallel connection and the VGL wiring 1 reach the position of the gate drive chip 5 after a certain distance, and the first wiring 31 after the second parallel connection is connected with the power pin of the gate drive chip 5. The gate drive chip 5 is driven by the power signals provided by the first wiring 31 after the second parallel connection, while the VGL wiring 1 surrounds and then pass through the gate drive chip 5. Then, after passing through the gate drive chip 5, the first wiring 31 after the second parallel connection and the VGL wiring 1 reach the position of the gate drive chip 6 after a certain distance. The first wiring 31 after the second parallel connection continues to connect with the power pin of the gate drive chip 6. The gate drive chip 6 is driven by the power signals provided by the first wiring 31 after the second parallel connection, and the VGL wiring 1 continues to surround and then pass through the gate drive chip 6.

After the first wiring 31 after the second parallel connection and the VGL wiring 1 pass through the gate drive chip 6, the VGL wiring 1 is parallelly connected with the first wiring 31 after the second parallel connection again, to form a first wiring 31 after the third parallel connection. At this time, the first PLG wirings 30 remains only one wiring, and the first wiring 31 after the third parallel connection reaches the position of the gate drive chip 7 after a certain distance, and is connected with the power pin of the gate drive chip 7. The gate drive chip 7 is driven by the power signals provided by the first wiring 31 after the third parallel connection. Then, after passing through the gate drive chip 7, the first wiring 31 after the third parallel connection reaches the position of the gate drive chip 8 after a certain distance. The first wiring 31 after the third parallel connection continues to connect with the power pin of the gate drive chip 8. The gate drive chip 8 is driven by the power signals provided by the first wiring 31 after the third parallel connection.

Figure 5:
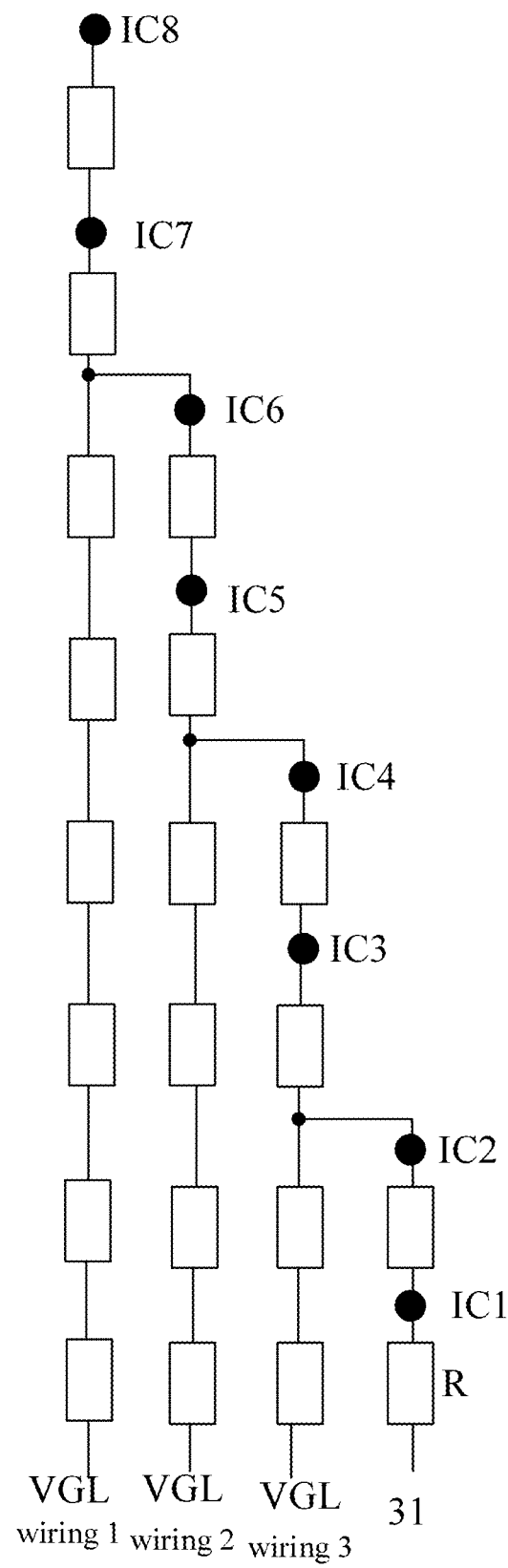
FIG. 5 illustrates an equivalent circuit diagram corresponding to the wirings shown in FIG. 2.

It may be known according to the above mentioned analysis, the equivalent circuit diagram corresponding to the wiring mode shown in FIG. 2 is shown in FIG. 5, the wiring resistance of the first PLG wirings 30 from the power signal end to the gate drive chip 1 and the wiring resistance of the first PLG wirings 30 between the two adjacent gate drive chips are assumed as R, then the wiring resistance of the first wiring 31 connected with the power pin of the gate drive chip 1 is R. and the wiring resistance of the first wiring 31 connected with the power pin of the gate drive chip 2 is 2R. Due to the VGL wiring 3 is parallelly connected with the first wiring 31, the wiring resistance after the parallel connection is R. The first wiring 31 after the parallel connection reaches the position of the gate drive chip 3 after another certain distance, and the wiring resistance becomes to 2R at this time, that is, the wiring resistance of the first wiring 31 connected with the power pin of the gate drive chip 3 is 2R; if the VGL wiring 3 is not parallelly connected with the first wiring 31, then the wiring resistance of the first wiring 31 connected with the power pin of the gate drive chip 3 may become to be 3R. The subsequent analysis process is similar. According to the above analysis processes, based on the parallel connections of the wirings, it makes the wiring resistance of each of the gate drive chips 211 connected with each group of the chip units 21 more balanced.

In addition, as shown in FIG. 2, a group of the second PLG wirings 40 is also disposed in the first bonding area 121 of each side. The second PLG wirings 40 is located on the side of the chip group 20 far away from the power signal end, and the second PLG wiring 40 is disposed by disconnecting with the chip group 20.

Wherein, the quantity of wirings included in the second PLG wirings 40 is equal to the quantity of wirings included in the first PLG wirings 30. For example, the first PLG wirings 30 include one first wiring 31 and three second wirings 32, the second PLG wirings 40 include one fourth wiring 41 and three fifth wirings 42.

The second PLG wirings 40 is not connected with each of the gate drive chips 211 in the chip group 20. By disposing the second PLG wirings 40 on the side far away from the power signal end of the chip group 20, the uniformity of wirings in the first bonding area 121 is improved.

In another optional embodiment of this disclosure, as shown in FIG. 3 and FIG. 4, two chip groups 20 and two groups of the first PLG wirings 30 are disposed in the first bonding area 121 on each side. The non-active area also includes the second bonding areas 122 located on the two opposite sides of the active area 11, and the side where each of the second bonding areas 122 located at is adjacent to the side where the first bonding area 121 located at. Moreover, the power signal end connected with a group of the first PLG wirings 30 is located in one of the second bonding area 122, and the power signal end connected with of the other group of the first PLG wirings 30 is located in the other second bonding area 122.

At this time, the second bonding areas 122 are disposed at the DP side and the DPO side of the active area 11, and the PCB is disposed in each of the second bonding areas 122. A group of the first PLG wirings 30 is connected with the PCB in one of the second bonding areas 122 through the golden fingers, and the other group of the first PLG wirings 30 is connected with the PCB in the other second bonding area 122 through the golden fingers.

The following description still takes the large scale display panel with resolution of 3840*2160 as an example to introduce the connecting relationship between the gate drive chips 211 and the first PLG wirings 30. At this time, the power signal end connected with a group of the first PLG wirings 30 is located in the second bonding area 122 of the DP side, and the power signal end connected with the other group of the first PLG wirings 30 is located in the second bonding area 122 of the DPO side. Moreover, 8 gate drive chips 211 are disposed in the first bonding area 121 on each side, and each of the gate drive chips 211 is capable to drive 270 gate lines. Therefore, two chip groups 20 are disposed in the first bonding area 121 on each side. Each of the chip groups 20 is divided into 4 groups of the chip units 21, each group of the chip units 21 includes a gate drive chip 211, and each group of the first PLG wirings 30 includes a first wiring 31 and three second wirings 32.

These three second wirings 32 are sequentially called VGL wiring 1. VGL wiring 2 and VGL wiring 3. From the direction of the DP side pointed to the DPO side, these eight gate drive chips 211 are agate drive chip 1 (IC1), agate drive chip 2 (IC2), agate drive chip 3 (IC3), agate drive chip 4 (IC4), a gate drive chip 5 (IC5), a gate drive chip 6 (IC6), a gate drive chip 7 (IC7) and a gate drive chip 8 (IC8), respectively. Each of the gate drive chips 211 is a group of the chip units 21, and the four groups of the chip units 21 corresponding to the gate drive chip 1, the gate drive chip 2, the gate drive chip 3 and the gate drive chip 4 are forming a chip group 20, which is close to the DP side, and the four groups of the chip units 21 corresponding to the gate drive chip 5, the gate drive chip 6, the gate drive chip 7 and the gate drive chip 8 are forming the other chip group 20, which is close to the DPO side.

For the chip group 20 close to the DP side, the input ends of the first wiring 31, the VGL wiring 1, the VGL wiring 2 and the VGL wiring 3 corresponding to the chip group 20 are connected with the same power signal end located at the DP side, and the first wiring 31 is also connected with the power pin of the gate drive chip 1. The gate drive chip 1 is driven by the power signals provided by the first wiring 31, while the VOL wiring 1, the VGL wiring 2 and the VGL wiring 3 surround and then pass through the gate drive chip 1. After the first wiring 31, the VGL wiring 1, the VGL wiring 2 and the VGL wiring 3 pass through the gate drive chip 1, the VGL wiring 3 is parallelly connected with the first wiring 31 to form a first wiring 31 after the first parallel connection. At this time, the first PLG wirings 30 remains only three wirings. The first wiring 31 after the first parallel connection, the VGL wiring 1 and the VGL wiring 2 reach the position of the gate drive chip 2 after a certain distance, and the first wiring 31 after the first parallel connection is connected with the power pin of the gate drive chip 2, the gate drive chip 2 is driven by the power signals provided by the first wiring 31 after the first parallel connection, while the VGL wiring 1 and the VGL wiring 2 surround and then pass through the gate drive chip 2. After the first wiring 31 after the first parallel connection, the VGL wiring 1 and the VGL wiring 2 pass through the gate drive chip 2, the VGL wiring 2 is parallelly connected with the first wiring 31 after the first parallel connection, to form a first wiring 31 after the second parallel connection, at this time, the first PLG wirings 30 remains only two wirings, the first wiring 31 after the second parallel connection and the VGL wiring 1 reach the position of the gate drive chip 3 after a certain distance, the first wiring 31 after the second parallel connection is connected with the power pin of the gate drive chip 3. The gate drive chip 3 is driven by the power signals provided by the first wiring 31 after the second parallel connection, while the VGL wiring 1 surround and then pass through the gate drive chip 3. After the first wiring 31 after the second parallel connection and the VGL wiring 1 pass through the gate drive chip 3, the VGL wiring 1 is parallelly connected with the first wiring 31 after the second parallel connection again, to form a first wiring 31 after the third parallel connection, at this time, the first PLG wirings 30 remains only one wiring. The first wiring 31 after the third parallel connection reaches the position of the gate drive chip 4 after a certain distance, and is connected with the power pin of the gate drive chip 4. The gate drive chip 4 is driven by the power signals provided by the first wiring 31 after the third parallel connection.

Similarly, for the other chip group 20 close to the DPO side, the input ends of the first wiring 31, the VOL wiring 1, the VOL wiring 2 and the VGL wiring 3 corresponding to the chip group 20 are connected with the same power signal end located at the DPO side, and the first wiring 31 is also connected with the power pin of the gate drive chip 8. The gate drive chip 8 is driven by the power signals provided by the first wiring 31, while the VGL wiring 1, the VGL wiring 2 and the VGL wiring 3 surround and then pass through the gate drive chip 8. After the first wiring 31, the VGL wiring 1, the VGL wiring 2 and the VGL wiring 3 pass through the gate drive chip 8, the VGL wiring 3 is parallelly connected with the first wiring 31 to form a first wiring 31 after the first parallel connection. At this time, the first PLG wirings 30 remains only three wirings. The first wiring 31 after the first parallel connection, the VGL wiring 1 and the VGL wiring 2 reach the position of the gate drive chip 7 after a certain distance, and the first wiring 31 after the first parallel connection is connected with the power pin of the gate drive chip 7, the gate drive chip 7 is driven by the power signals provided by the first wiring 31 after the first parallel connection, while the VGL wiring 1 and the VGL wiring 2 surround and then pass through the gate drive chip 7. After the first wiring 31 after the first parallel connection, the VGL wiring 1 and the VGL wiring 2 pass through the gate drive chip 7, the VGL wiring 2 is parallelly connected with the first wiring 31 after the first parallel connection, to form a first wiring 31 after the second parallel connection, at this time, the first PLG wirings 30 remains only two wirings, the first wiring 31 after the second parallel connection and the VGL wiring 1 reach the position of the gate drive chip 6 after a certain distance, the first wiring 31 is connected with the power pin of the gate drive chip 6. The gate drive chip 6 is driven by the power signals provided by the first wiring 31 after the second parallel connection, while the VGL wiring 1 surrounds and then pass through the gate drive chip 6. After the first wiring 31 after the second parallel connection and the VGL wiring 1 pass through the gate drive chip 6, the VGL wiring 1 is parallelly connected with the first wiring 31 after the second parallel connection again, to form a first wiring 31 after the third parallel connection, at this time, the first PLG wirings 30 remains only one wiring. The first wiring 31 after the third parallel connection reaches the position of the gate drive chip 5 after a certain distance, and is connected with the power pin of the gate drive chip 5. The gate drive chip 5 is driven by the power signals provided by the first wiring 31 after the third parallel connection.

Figure 6:
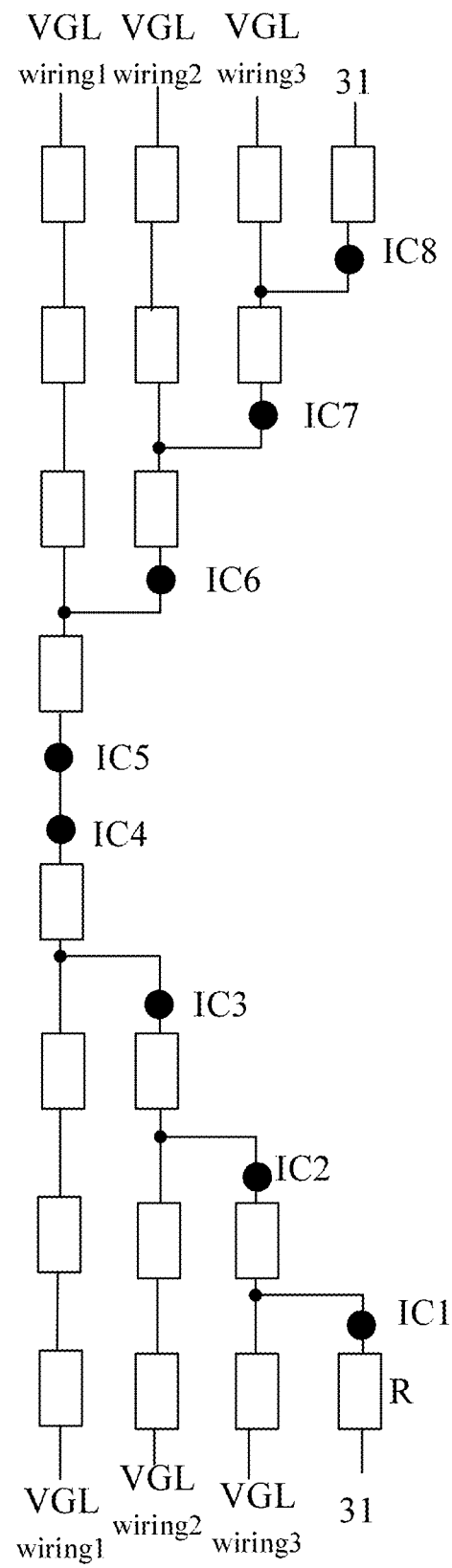
FIG. 6 illustrates an equivalent circuit diagram corresponding to the wirings shown in FIG. 3.
Figure 7:
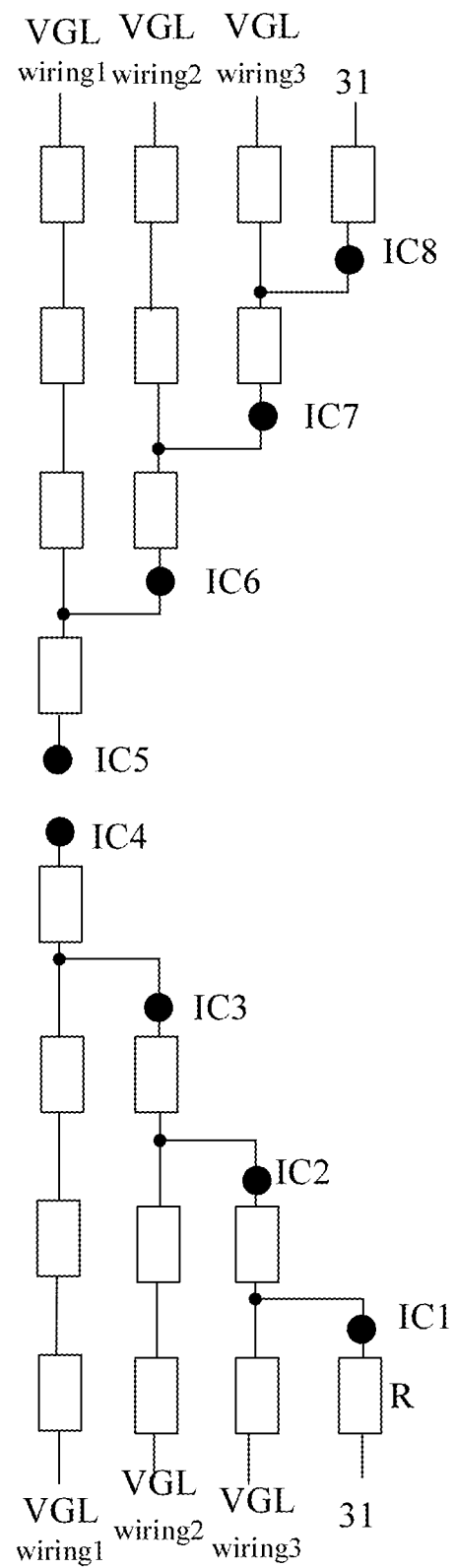
FIG. 7 illustrates an equivalent circuit diagram corresponding to the wirings shown in FIG. 4.

It may be known according to the above mentioned analysis, the equivalent circuit diagram corresponding to the wiring mode shown in FIG. 3 is shown in FIG. 6, the equivalent circuit diagram corresponding to the wiring mode shown in FIG. 4 is shown in FIG. 7, the wiring resistance of the first PLG wirings 30 from the power signal end to the gate drive chip 1 and the wiring resistance of the first PLG wirings 30 between the two adjacent gate drive chips are assumed as R, then the wiring resistance of the first wiring 31 connected with the power pin of the gate drive chip 1 is R, due to the VGL wiring 3 is in parallel connection with the first wiring 31, then the wiring resistance after the parallel connection is R/2, the first wiring 31 after the parallel connection reaches the position of the gate drive chip 2 after passing through a certain distance again, the wiring resistance is changed to 3R/2 at this time, that is, the wiring resistance of the first wiring 31 connected with the power pin of the gate drive chip 2 is 3R/2. If the VGL wiring 3 is not in parallel connection with the first wiring 31, then the wiring resistance of the first wiring 31 connected with the power pin of the gate drive chip 2 may be changed to 2R. The subsequent analysis processes are similar. According to the above analysis processes, based on the parallel connections of the wirings, it makes the wiring resistances of each of the gate drive chips 211 connected with each group of the chip units 21 more balanced.

In practical products, as shown in FIG. 3, the power pin of a first edge chip and the power pin of a second edge chip are connected through a third wiring 33. Or, as shown in FIG. 4, the power pin of the first edge chip and the power pin of the second edge chip are disposed by disconnecting. Two chip groups 20 are a first chip group and a second chip group, the first edge chip is the gate drive chip 211 in the first chip group closet to the second chip group, and the second edge chip is the gate drive chip 211 in the second chip group closet to the first chip group.

In FIG. 3 and FIG. 4, the first edge chip refers to the gate drive chip 4, and the second edge chip refers to the gate drive chip 5. As shown in FIG. 3, the power pin of the gate drive chip 4 are connected with the power pin of the gate drive chip 5 through the third wiring 33, to realize the voltage balance between the two chip groups 20. As shown in FIG. 4 the power pin of the gate drive chip 4 and the power pin of the gate drive chip 5 are disposed by disconnecting, that is, each of the two chip groups is separately controlled by the corresponding first PLG wirings 30, and the two chip groups may not affect each other.

In this embodiment of the application, the total quantity of the first wiring 31 and the second wirings 32 included by each group of the first PLG wirings 30 is equal to the group quantity of the chip units 21 included by each of the chip groups 20. Moreover, the quantity of the gate drive chips 211 included by each group of the chip units 21 is equal.

As shown in FIG. 2 to FIG. 4, each group of the first PLG wirings 30 includes one first wiring 31 and three second wirings 32, that is, the total quantity of the first wiring 31 and the second wirings 32 included in each group of the first PLG wirings 30 is four, and the group quantity of the chip units 21 included in each of the chip groups 20 is four.

Moreover, in FIG. 2, the quantity of the gate drive chips 211 included by each group of the chip units 21 is two. In FIG. 3 and FIG. 4, the quantity of the gate drive chips 211 included by each group of the chip units 21 is one.

When the total quantity of the first wiring 31 and the second wirings 32 included by each group of the first PLG wirings 30 is equal to the group quantity of the chip units 21 included in each of the chip groups 20, it makes that the first PLG wirings 30 connected with the last chip units 21 only includes the first wiring 31, that is, by disposing that the second wiring 32 is in parallel connection with the first wiring 31, it can achieve the balance of the wiring resistance of each of the gate drive chips 211, at the same time, it may minimize the total quantity of wirings included by the first PLG wirings 30, to reduce the materials required for the first PLG wirings 30.

It should be noted that the group quantity of the chip units 21 included in each of the chip groups 20 is not limited to the four groups shown in FIG. 2 to FIG. 4, and it may also be divided into two groups, three groups and five groups. Moreover, the quantity of the gate drive chips 211 included in each group of the chip units 21 is not limited to one as shown in FIG. 3 and FIG. 4, and two as shown in FIG. 2, which may also be three and so forth.

In addition, each of the chip units 21 includes at least two gate drive chips 211. In the same chip unit 21, there is no connecting relationship between the first wiring 31 and the second wiring 32. Which means, when each of the chip units 21 includes at least two gate drive chips 211, in the same chip unit 21, the first wiring 31 does not contact with each of the second wirings 32.

Figure 8:
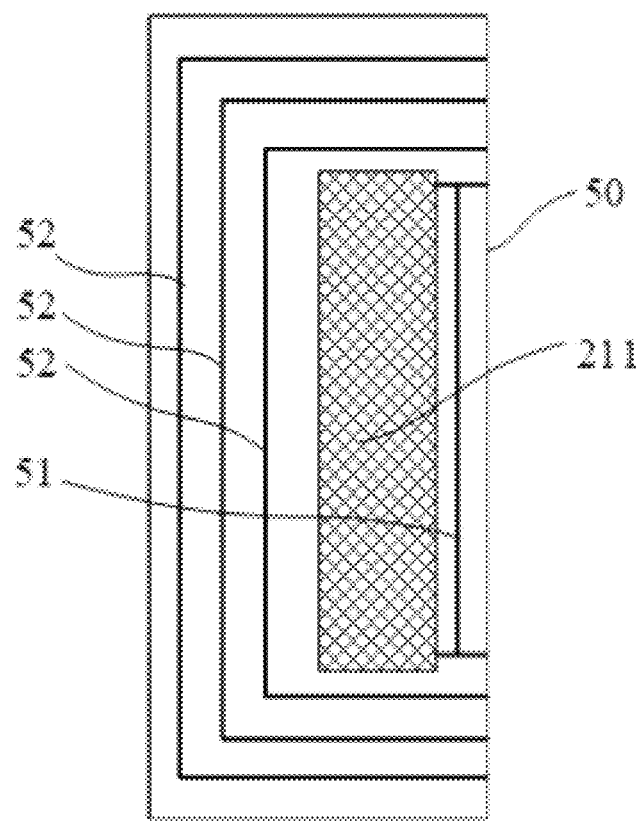
FIG. 8 illustrates a structural schematic diagram of a first chip on film.

As shown in FIG. 2 and FIG. 8, a first chip on film 50 is disposed in the first bonding area 121 of each side, each of the gate drive chips 211 is bonded to the first bonding area 121 through the first chip on film 50, a first connecting line 51 and at least one second connecting line 52 are disposed on the first chip on film 50. The first wiring 31 is disposed at the position of the gate drive chip 211 by disconnecting, and the first wiring 31 disposed by disconnecting is connected through the first connecting line 51. The second wiring 32 is disposed at the position of the gate drive chip 211 by disconnecting, and the second wiring 32 disposed by disconnecting is connected through the second connecting line 52.

In practical products, the first chip on film 50 refers to the COF (Chip On Film) corresponding to the gate drive chip 211. The gate drive chip is disposed on the first chip on film 50, to bond the gate drive chip 211 in the first bonding area 121 through the first chip on film 50.

Wherein, the wirings connected with the first PLG wirings 30 is disposed on each of the first chip on films 50, which are the first connecting line 51 and at least one of the second connecting lines 52. Trough the first connecting line 51, the first wirings 31 disposed by disconnecting are connected together. When one of the second wirings 32 which is not parallelly connected with the first wiring 31 exists between two adjacent gate drive chips 211, the second wirings 32 disposed by disconnecting are connected together by the corresponding second connecting line 52. After the second wiring 32 is parallelly connected with the first wiring 31 between the two adjacent gate drive chips 211, or the second wiring 32 does not exist between the two adjacent gate drive chips 211, the corresponding second connecting line 52 is a signal line disposed by disconnecting.

For example, as shown in FIG. 2, the first wiring 31 between the gate drive chip 6 and the gate drive chip 7, and the first wiring 31 between the gate drive chip 7 and the gate drive chip 8, are disposed at the position of the gate drive chip 7 by disconnecting, the first wirings 31 disposed by disconnecting are connected through the first connecting line 51 disposed on the first chip on film 50 corresponding to the gate drive chip 7. Correspondingly, the VGL wiring 1 between the gate drive chip 4 and the gate drive chip 5, and the VGL wiring 1 between the gate drive chip 5 and the gate drive chip 6, are disposed at the position of the gate drive chip 5 by disconnecting, the second wirings 32 disposed by disconnecting are connected through the second connecting line 52 disposed on the first chip on film 50 corresponding to the gate drive chip 5. When only the first wiring 31 exists between the gate drive chip 7 and the gate drive chip 8 but no second wiring 32 exists, the second connecting lines 52 disposed on the gate drive chip 7 and the gate drive chip 8 are not connected with each other.

It should be noted that, the quantity of the second connecting lines 52 disposed on each of the first chip on film 50 is equal to the quantity of the second wirings 32 included by each group of the first PLG wirings 30.

It should be noted that the occupied area of the first bonding area 121 may be reduced by disposing the first connecting line 51 and the second connecting line 52 on the first chip on film 50 to connect with the first wirings 31 and the second wirings 32 disposed by disconnecting. If the first wiring 31 and the second wirings 32 comprised in the first PLG wirings 30 disposed in the first bonding area 121 are directly connected, rather than connected through the first chip on film 50, due to the film of the first PLG wirings 30 is relatively thin, therefore, it needs a large area to reduce the wiring resistance, which may make the occupied area of the first bonding area 121 large, while the film thickness of the first connecting line 51 and the second connecting line 52 disposed on the first chip on film 50 is relatively large, and the corresponding resistance is small, so the required area is reduced. Therefore, it makes the occupied area of the first bonding area 121 small.

Figure 9:
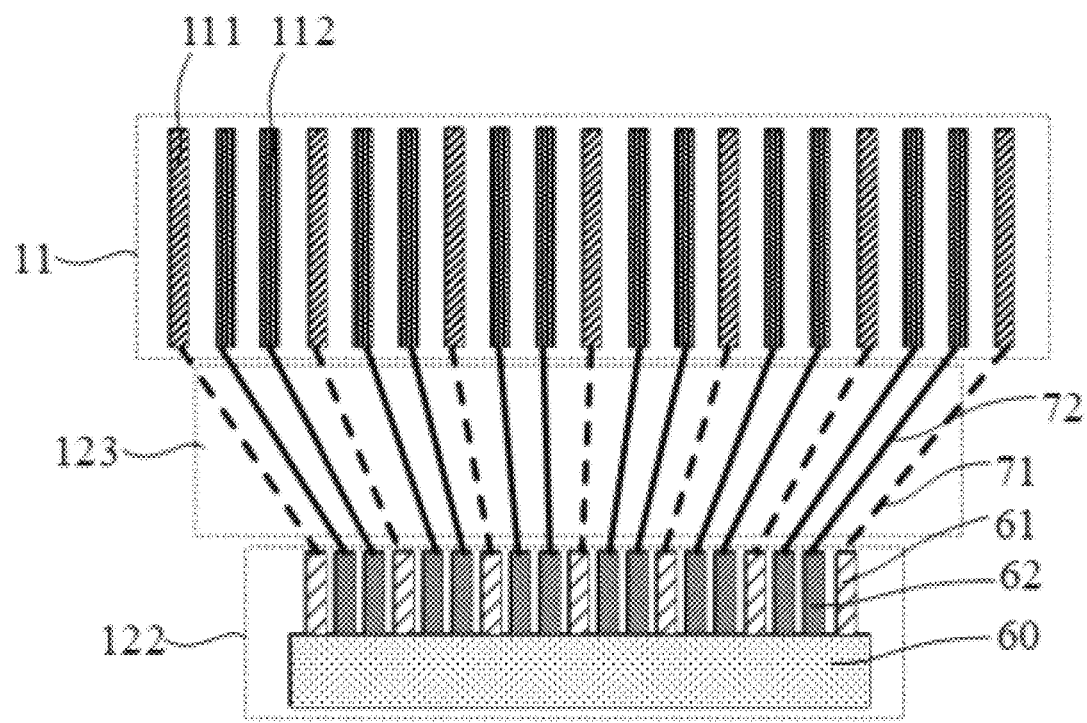
FIG. 9 illustrates a schematic diagram of the connecting relationship between touch display drive chips and data lines and touch signal lines.

In this embodiment of the application, as shown in FIG. 1 and FIG. 9, the display panel 10 is an embedded touch panel. The non-active area also includes the second bonding area 122 located at least one side of the two opposite sides of the active area 11, and a fan-out area 123 located at one side of each of the second bonding areas 122 close to the active area 11. The display module also includes a touch display drive chip 60 located in each of the second bonding areas 122. A plurality of data lines 111 and a plurality of touch signal lines 112 are disposed in the active area 11, a plurality of display leads 71 and a plurality of touch leads 72 are disposed in the fan-out area 123, and the touch display drive chip 60 has a plurality of display pins 61 and a plurality of touch pins 62. One end of each of the display leads 71 is connected with the data line 111 and the other end is connected with the display pin 61. One end of each of the touch leads 72 is connected with the touch signal line 112, and the other end is connected with the touch pin 62. Among them, along the row direction of the display panel 10, the distribution patterns of the display pins 61 and the touch pins 62 of the touch display drive chips 60 are the same as those of the data lines 111 and the touch signal lines 112 in the active area 11. The display lead 71 and the touch control lead 72 are disposed in the same layer.

In practical products, the display panel 10 is an embedded touch panel, which is to dispose the touch electrodes inside the display panel 10. At this time, a plurality of data lines 111 and a plurality of touch signal lines 112 are disposed in the active area 11.

The non-active area further includes the second bonding area 122 and the fan-out area 123 located at the position between the second bonding area 122 and the active area 11. At least one of the touch display drive chip 60 is disposed in the second bonding area 122, which is a touch and display driver integration (TDDI) chip, through the touch display drive chip 60 to drive the data line 111 and the data line 112 at the same time. Each of the touch display drive chips 60 has a plurality of display pins 61 and a plurality of touch pins 62, and a plurality of display leads 71 and a plurality of touch leads 72 are disposed in the fan-out area 123, the data line 111 and the display pin 61 are connected by each of the display leads 71, the touch signal line 112 and the touch pin 62 are connected by each of the touch leads 72.

In addition, along the row direction of the display panel 10, the distribution patterns of the display pins 61 and the touch pins 62 of the touch display drive chips 60 are the same as those of the data lines 111 and the touch signal lines 112 in the active area 11. That is, the arrangement order of the data lines 111 and the touch signal lines 112 in the active area 11 is the same as that of the display pins 61 and the touch pins 62 in the touch display drive chips 60. Therefore, only one layer of lead layer may be disposed in the fan-out area 123, the lead layer includes the display leads 71 and the touch leads 72, which makes the display leads 71 and the touch leads 72 to be disposed in the same layer.

In related art, all display pins in each of the touch display drive chips are concentrated in the middle, and the touch pins are evenly distributed at both ends of the display pins. For example, the quantity of the display pins in the touch display drive chip is 480, and the quantity of the touch pins is 960. Then, along the distribution direction of each of the pins, 480 touch pins, 480 display pins and 480 touch pins are distributed in sequence. Or, all of the touch pins in each of the touch display drive chips are concentrated in the middle, and the display pins are evenly distributed at both ends of the touch pins. For example, the quantity of the display pins in the touch display drive chip is 480, and the quantity of the touch pins is 960. Then, along the distribution direction of each of the pins, 240 display pins, 960 touch pins and 240 display pins are distributed in sequence. However, since the data lines 111 and the touch signal lines 112 disposed in the active area 11 are crossly arranged, for example, the distribution ratio of the data lines 111 and the touch signal lines 112 is 1:2, that is, two touch signal lines 112 are distributed behind of each of the data lines 111, and two touch signal lines 112 are distributed between two adjacent data lines 11. At this time, in order to avoid the interaction effect between the data lines 111 and the touch signal lines 112, it is necessary to dispose two layers of wiring layers in the fan-out area 123. One layer of the wiring layers is used to dispose the display leads, and the other layer is used to dispose the touch leads. Therefore, the distribution patterns of related art is to dispose two layers of wiring layers in the fan-out 123, resulting in larger vertical occupation space in the fan-out 123, and the touch leads and the display leads may produce overlapping capacitances in the fan-out 123.

In this embodiment of the application, by disposing the distribution pattern of the display pins 61 and the touch leads 62 in the touch display drive chips 60 as same to the distribution pattern of the data lines 111 and the touch signal lines 112 in the active area 11, only one layer of lead layer is disposed in the fan-out 123, which may distribute the display leads 71 and the touch leads 72, so as to reduce the vertical occupation space of the fan-out 123. The experimental results show that by comparing with the first way in related art (the display pins are concentrated in the middle, and the touch pins are evenly distributed at both ends of the display pins), its space occupied area is saved by 10%. By comparing with the second way in related art (the touch pins are concentrated in the middle and the display pins are evenly distributed at both ends of the touch pins), its space occupied area is saved by 30%. Moreover, when the display leads 71 and the touch leads 72 are disposed at the same layer, there is no direct overlapping capacitance between the display leads 71 and the touch leads 72. At this time, the coupling capacitance is only the lateral capacitance between the display leads 71 and the touch leads 72, and the coupling capacitance is small and uniform.

It should be noted that the non-display area may include two second bonding areas 122, and each of the second bonding areas 122 is provided with the touch display drive chip 60. The same data line 111 is connected to the display pins 61 of the touch display drive chips 60 located in two second bonding areas 122, that is, through the touch display drive chips 60 located in two second bonding areas 122, the same data line 111 is driven bilaterally, thereby reducing the delay of the data line 111 and improving the charging rates of the sub-pixels connected with the data line 111. The touch electrodes of the embedded touch display panel are divided into two parts along the row direction. The touch signal line 112 connected with one part of the touch electrodes are controlled by the touch display drive chip 60 in the second bonding area 122 on the DP side. The touch signal line 112 connected with the other part of the touch electrodes are controlled by the touch display drive chip 60 in the second bonding area 122 on the DPO side, so as to reduce the load of the touch signal line 112 and improve the touch performance. Certainly, the non-active area may also include a second bonding area 122, that is, the second bonding area 122 on the DP side or the second bonding area 122 on the DPO side. At this time, the touch display drive chip 60 is disposed in this second bonding area 122 to realize the unilateral drive of the data line 111 and the touch signal line 112.

In some optional embodiments, the quantity ratio of the touch signal line 112 and the data line 111 connected with each of the touch display drive chips 60 is X. X touch pins 62 are disposed between any two adjacent display pins 61, and X is a positive integer.

In some products, the data lines 111 and the touch signal lines 112 disposed in the active area 11 are proportionally distributed according to a fixed integer ratio. For example, the data lines 111 and the touch signal lines 112 disposed in the active area 11 may be distributed in a 1:2 manner. At this time, the quantity ratio of the touch signal lines 112 and the data lines 111 connected with each of the touch display drive chips 60 is 2, and there are two touch pins 62 between any two adjacent display pins 61. Or, the data lines 111 and the touch signal lines 112 disposed in the active area 11 may be distributed in the manner of 1:3. At this time, the quantity ratio of the touch signal lines 112 to the data lines 111 connected with each of the touch display drive chips 60 is 3, and there are three touch pins 62 between any two adjacent display pins 61.

Figure 10:
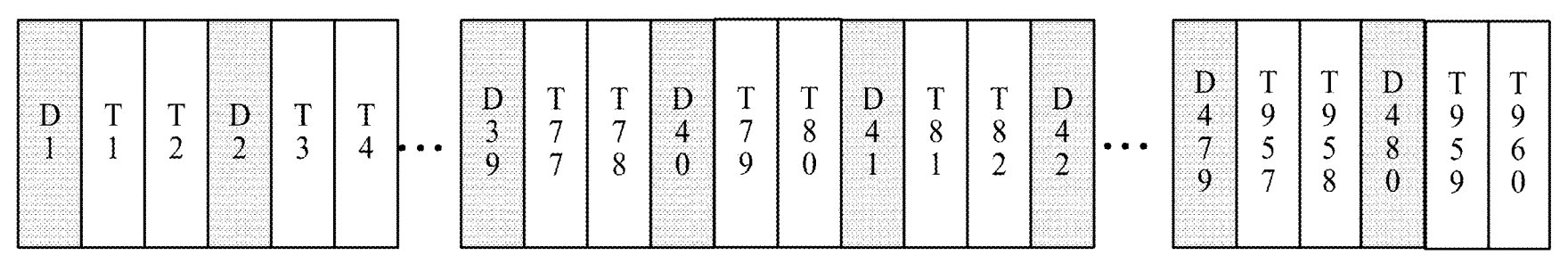

For example, as shown in FIG. 10, the quantity of the touch signal lines 112 connected to each of the touch display drive chips 60 is 960, and the quantity of the data lines 111 connected to each of the touch display drive chip 60 is 480, that is, the quantity ratio of the touch signal lines 112 to the data lines 111 is 2. Accordingly, the quantity of the display pins 61 included by each of the touch display drive chips 60 is 480, such as the first display pin D1, the second display pin D2, until to the 480$^{th}$ display pin D480, and the quantity of the touch pins 62 included by each of the touch display drive chips 60 is 960. For example, the first touch pin T1, the second touch pin T2, the third touch pin T3, the fourth touch pin T4, until to the 960$^{th}$ touch pin T960, and there are two touch pins 62 disposed between any two adjacent display pins 61.

It should be noted that, at this time, the distribution of pins as shown by the touch drive chips 60 applies to the manner of unilaterally driving of the data lines 111 and the touch signal lines 112. If using the manner bilaterally driving, then at this time, it needs to disposed dummy pins corresponding to T959 and T960 in the touch display drive chips 60 of DP side and DPO side, which makes the touch display drive chips 60 corresponding to both opposite sides are mirror-symmetrical relative to the row direction, that is, after the touch display drive chip 60 of either of the opposite sides rotates 180°, it is exactly the same as the touch display drive chip 60 on the other side, to ensure that the second chip on films used by the touch display drive chips 60 of both opposite sides are the same.

In other optional embodiments, the quantity of the touch signal lines 112 connected by each of the touch display drive chips 60 is equal to the difference between the quantity of the data lines 111 connected by X times and Y. The pins of each of the touch display drive chips 60 are divided into Y/X pin groups. In the same pin group, the first pin and the last pin are display pin 61, and X touch pins 62 are disposed between two adjacent display pins 61. Moreover, the distribution of pins in each of the pin groups is the same; wherein X, Y and Y/X are positive integers greater than or equal to 1. For the touch signal lines 112 and the data lines 111 connected to each of the touch display drive chips 60, the absolute value of the difference between the quantity of the touch signal lines 112 and (X+1) times the quantity of the data lines 111 and the absolute value of the difference between the quantity of the touch signal lines 112 and (X−1) times the quantity of the data lines 111 are greater than Y.

In some products, the data lines 111 and the touch signal lines 112 disposed in the active area 11 are not distributed according to the integer ratios. At this time, the quantity ratio of the touch signal lines 112 to the data lines 111 connected by each of the touch display drive chips 60 is not a positive integer. At this time, in each of the touch display drive chips 60, the difference between the quantity of the display pins 61 by X times and Y is equal to the quantity of the touch pins 62, that is, the quantity of the touch signal lines 112 connected by each of the touch display drive chips 60 is equal to the difference between the quantity of the display pins 61 by X times and Y.

At this time, it is necessary to divide the pins of the touch display drive chips 60 into Y/X pin groups, so that the distribution of pins in each of the pin groups are the same. Moreover, in the same pin group, the first pin and the last pin are display pin 61, and X touch pins 62 are disposed between two adjacent display pins 61.

For example, for the 86-inch 4K embedded touch display panel, the quantity of touch electrodes is 288*156, and the total quantity of the required touch signal lines 112 is 44928, while the quantity of the data lines 111 is 11520. The embedded touch display panel is provided with 48 touch display drive chips 60, and 24 touch display drive chips 60 are distributed on the DP side and the DPO side respectively, the data lines 111 are driven bilaterally, and the touch signal lines 112 are divided into two parts, 22464 touch signal lines 112 are driven by the touch display drive chip 60 of the DP side, and the remaining 22464 touch signal lines 112 are driven by the touch display drive chip 60 of the DPO side. Therefore, each of the touch display drive chips 60 needs to drive 480 data lines 111 and 936 touch signal lines 112. At this time, the quantity ratio of the touch signal lines 112 to the data lines 111 connected by each of the touch display drive chip 60s is not a positive integer, and the quantity of the touch signal lines 112 connected by each of the touch display drive chips 60 is 936, which is equal to the difference between the quantity of 480 of the connected data lines 111 by 2 times and 24, that is, the quantity of X is equal to 2 and Y is equal to 24.

Figure 11:
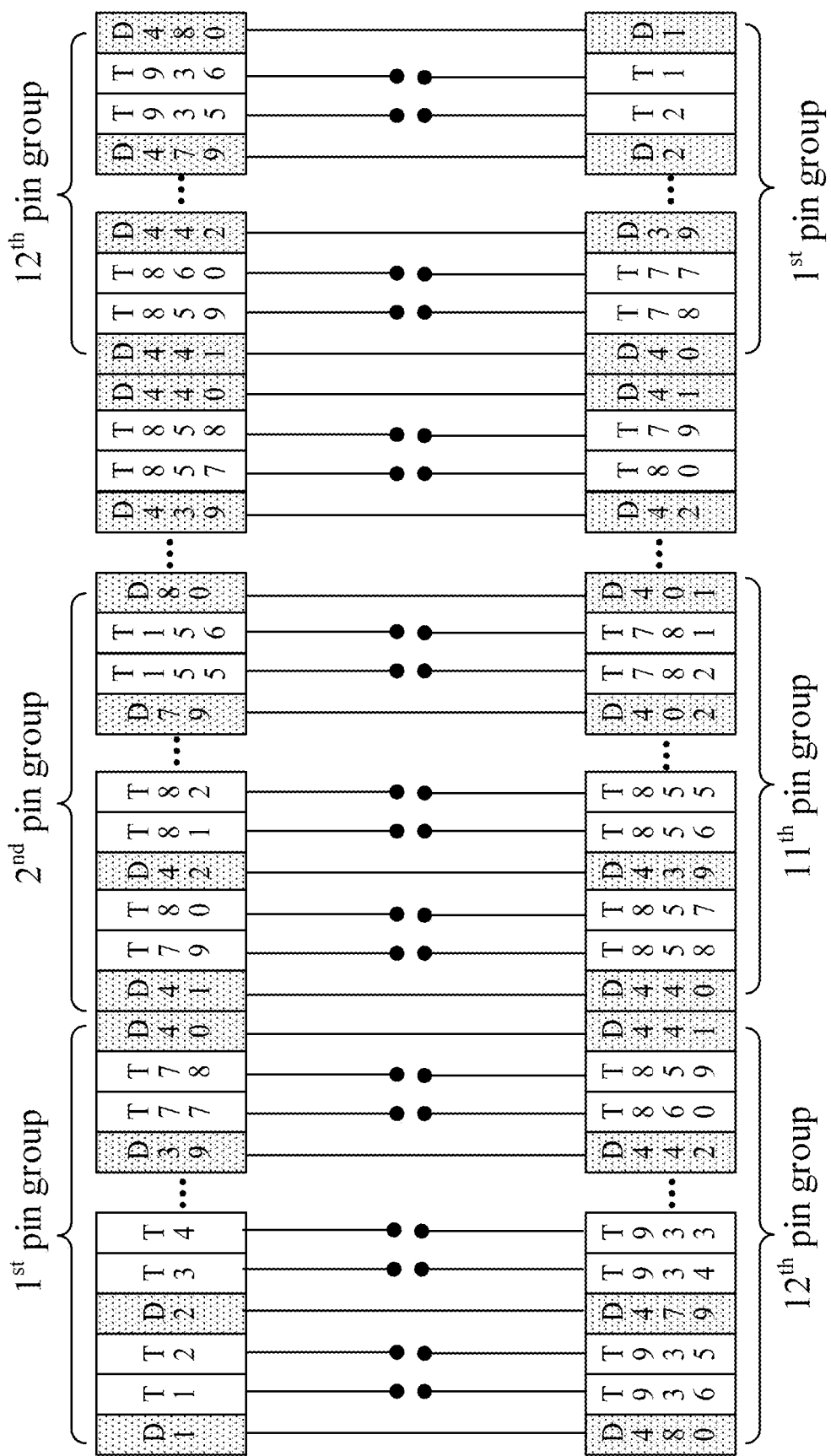
FIG. 11 illustrates a schematic diagram of the distribution of pins of the second touch display drive chips.

Therefore, as shown in FIG. 11, the pins of each of the touch display drive chips 60 are divided into 12 pin groups, each of the pin groups includes 40 display pins 61 and 78 touch pins 62. The pins included in the first pin group are as follows: the first display pin D1, the first touch pin T1, the second touch pin T2, the second display pin D2, the third touch pin T3, and the fourth touch pin T4, until to the 39$^{th}$ display pin D39, the 77$^{th}$ touch pin T77, the 78$^{th}$ touch pin T78 and the 40$^{th}$ display pin D40. The second pin group starts with the 41$^{st}$ display pin D41, and no touch pin is disposed between the 40$^{th}$ display pin D40 and the 41$^{st}$ display pin D41. In each of the pin groups, the first pin and the last pin are display pin 61, and two touch pins 62 are disposed between the two adjacent display pins 61.

It should be noted that for the touch signal lines 112 and the data lines 111 connected to each of the touch display drive chips 60, the absolute value of the difference between the quantity of the touch signal lines 112 and (X+1) times the quantity of the data lines 111, and the absolute value of the difference between the quantity of the touch signal lines 112 and (X−1) times the quantity the data line 111, are set to be greater than Y, which may minimize the quantity of the pin groups that are divided and make the distribution of the pins of the touch display drive chips 60 simpler.

When the data lines 111 and the touch signal lines 112 in some display products are not distributed in the manners of integer ratio, if the pins included in the touch display drive chips 60 are still distributed in a fixed proportion, then it is necessary to add dummy pins in the touch display drive chips 60. For example, two dummy pins are added between the 40th display pin D40 and the 41st display pin D41, which increases the quantity of the pins in the touch display drive chips 60, and the dummy pins may cause a waste of space, and lead to a non-uniform distribution of the wirings in the fan-out area 123. Therefore, the embodiment of this application divides the pins included in the touch display drive chips 60, the pins in the same pin group are still distributed in a fixed proportion, while the fixed proportion is broken between the adjacent two pin groups, so as to reduce the quantity of the pins and the occupation space of the touch display drive chips 60, and make the wirings in the corresponding fan-out area 123 uniformly distributed.

In some products, the quantity of the data lines 111 disposed in the active area 11 is N, the quantity of the touch display drive chips 60 disposed in each of the second bonding areas 122 is M, and the quantity of the display pins 61 included in each of the touch display drive chips 60 is N/M. N and M are both positive even numbers, and N is greater than M.

If the data lines 111 are driven bilaterally, and the quantity of the data lines 111 disposed in the active area 11 is even N, the quantity of the touch display drive chips 60 used is 2M, and the quantity of the touch display drive chips 60 disposed in each of the second bonding areas 122 is M. At this time, the data lines 111 are evenly distributed according to the quantity of the touch display drive chips 60 disposed in each side, that is, the quantity of the display pins 61 included in each of the touch display drive chips 60 is N/M, that is, each of the touch display drive chips 60 drives N/M data lines 111.

For example, as shown in FIG. 11, for the 86-inch 4K embedded touch display panel, it includes 11520 data lines, and 24 touch display drive chips 60 are distributed on the DP side and the DPO side respectively, then each of the touch display drive chips 60 includes 480 display pins 61 to drive 480 data lines 111.

In some other products, the quantity of the data lines 11l disposed in the active area 11 is N+1, and the quantity of the touch display drive chips 60 disposed in each of the second bonding areas 122 is M. The touch display drive chips 60 are divided into two categories, which are the first category drive chips and the second category drive chips; the quantity of the first category drive chips is M−1, and the quantity of the display pins 61 included thereof is N/M. The quantity of the second category drive chips is 1, and the display pins 61 included thereof are divided into the first display pins and the second display pins. The quantity of the first display pins is N/M, and the quantity of the second display pins is 1; N and M are positive even numbers, and N is greater than M. The second display pins of the second category drive chips are located in front or behind of all rest pins in the second category drive chips.

When the data lines 111 are driven bilaterally, and the quantity of the data lines 111 disposed in the active area 11 is odd N+1, the quantity of the touch display drive chips 60 used is 2M, then the quantity of the touch display drive chips 60 disposed in each of the second bonding areas 122 is M. At this time, the touch display drive chips 60 are divided into two categories. The quantity of the first category drive chips is M−1, and the quantity of the display pins 61 included thereof is N/M. The quantity of the second category drive chips is 1, and the quantity of the display pins 61 included thereof is 1+N/M. The display pins included in the second category drive chips are divided into the first display pins and the second display pins. The quantity of the first display pin is N/M, and the quantity of the second display pins is 1. The second display pins are located in front or behind of all rest pins in the second category drive chips.

Figure 12:
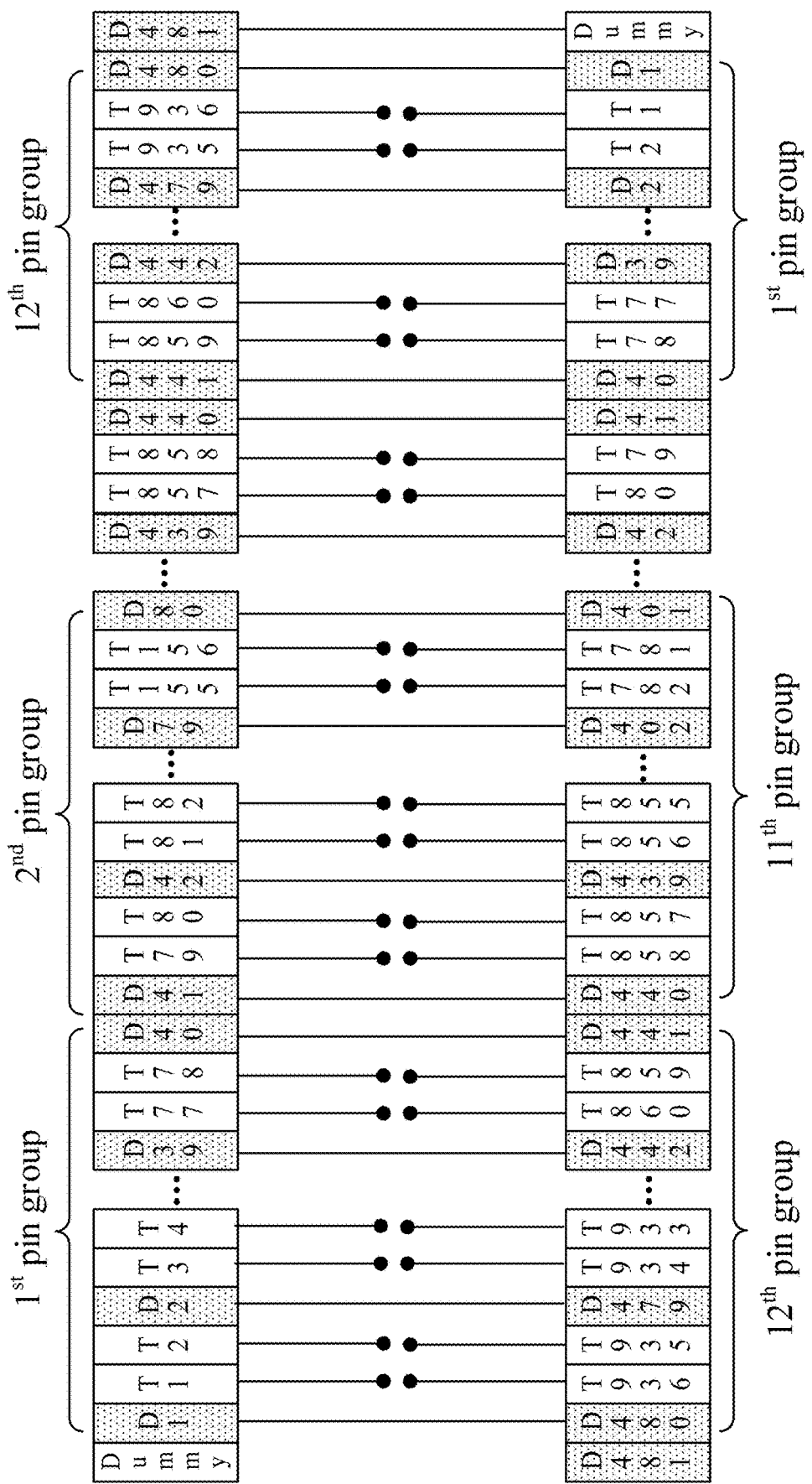
FIG. 12 illustrates a schematic diagram of the distribution of pins of the third touch display drive chips.

For example, the data lines included in the display panel 10 is 11521, and the quantity of the touch display drive chips 60 disposed in each of the second bonding areas 122 is 24. 23 touch display drive chips 60 are the first category drive chips, which include 480 display pins 61, and the remaining one touch display drive chip 60 is the second category drive chip, which includes 481 display pins 61. As shown in FIG. 12, the first display pins in the second category drive chip start from the display pin D1 to the display pin D480, and the second display pin in the second drive chip is D481. Then the second display pin D481 is disposed after all the remaining pins in the second category driving chip, that is, it is disposed behind of the first display pin D480, and certainly, it may be also disposed in front of the first display pin D1.

In addition, the second bonding areas 122 included by the non-active area are located at the opposite sides of the active area 11. Each of the second bonding areas 122 on each side is also provided with the second chip on film 82, and each of the touch display drive chips 60 is bound in each of the second bonding areas 122 through the second chip on film 82. In the second bonding area 122 of the first side and the second bonding area 122 of the second side, the second category drive chip also includes a first dummy pin, the first category drive chip further includes two second dummy pins. In the second drive chip, the first dummy pin and the second display pin are located on both sides of all remaining pins. Moreover, the first dummy pin in the second category drive chip on one side and the second display pin in the second category drive chip on the other side are connected to the same data line 111.

When the quantities of the data lines 11 driven by each of the touch display drive chips 60 are inconsistent, in order to ensure that each of the touch display drive chips 60 uses the same second chip on film 82, it is necessary to add a first dummy pin in the second category drive chip, and add two second dummy pins in the first category drive chip, so that each of the touch display drive chips 60 has the same total quantity of pins, then the quantities of wirings on the second chip on film used by each of the touch display drive chips 60 are also equal, so that the touch display drive chip 60s which drive different quantities of the data lines 111 may use the same second chip on film 82 to simplify the design requirements of the second chip on film 82.

Moreover, in the first category drive chips, the two additional second dummy pins may be located at both sides of all of the remaining pins.

For example, as shown in FIG. 12, the second category drive chip further includes the first dummy pin, the first dummy pin and the second display pin D481 are located on both sides of all remaining pins, and the first dummy pin on the DP side and the second display pin D481 on the DPO side are connected to the same data line 111, while there is no data line 111 between the first dummy pin on the DPO side and the second display pin D481 on the DP side. Moreover, the first dummy pin on the DP side does not output data signal, but only outputs the corresponding data signal through the second display pin D481 to control the data line 111 connected to it. At this time, the total quantity of other pins except the touch pin 62 in the second category drive chip is 482. Accordingly, for the other 23 first category drive chips, two second dummy pins are also needed to be added, so that the total quantities of other pins except the touch pin 62 in the first category drive chips are 482 as well.

It should be noted that for each of the first category drive chip, only two second dummy pins are added, and there is no wiring connected to the second dummy pin disposed in the fan-out area 123 and the active area 111. For the second category drive chip, it not only adds a first dummy pin, but also has a wiring connected to it in the fan-out area 123 and the active area 111.

In practical products, PCB81 is also disposed in each of the second bonding areas 122, and PCB81 needs to be bound with the second chip on film 82 to provide the corresponding signals to the touch display drive chips 60 disposed on the second chip on film 82.

In the embodiment of this application, by dividing the chip groups into at least two groups of chip units, and the first wiring connected by the power pin of the last gate drive chip in the previous group of chip units and any second wiring are connected in parallel to the power pin of the first gate drive chip in the next group of chip units, the wiring resistance between each of the gate drive chips in each group of the chip units is more balanced. Therefore, the difference in the voltage value of the power signal provided to each of the gate drive chip in each group of the chip units is reduced. Correspondingly, the luminance difference of pixels driven by the gate drive chip in each group of the chip units is also reduced, so as to reduce the display stripes of the display panel.

This embodiment of the application further provides a display apparatus, includes the display module as mentioned above.

In practical applications, the display apparatus may be: a mobile phone, a tablet, a monitor, a laptop, an navigator or any products or components with display and touch functions.

In addition, with regard to the specific structure of the display module in the display apparatus, which may be referred to the above descriptions of the display module, and the effect is similar to that achieved by the above display module, which is may not be specified here in order to avoid repeated descriptions.

The term "one embodiment". "one embodiment" or "one or more embodiments" herein means that the particular features, structures or features described in combination with embodiments are included in at least one embodiment of this application. Also, note that the examples of words "in an embodiment" here do not necessarily all refer to the same embodiment.

A great deal of details are given in the manual provided here. However, it is understood that embodiments of this application can be practiced without these specific details. In some instances, known methods, structures and techniques are not detailed so as not to obscure the understanding of this specification.

In claims, no reference symbol between parentheses shall be constructed to restrict the claim. The word "include" does not exclude the existence of elements or steps not listed in the claim. The word "one" or "one" before a component does not preclude the existence of more than one such component. This application can be implemented with the help of hardware consisting of several different components and with the help of a properly programmed computer. In listing the unit claims of several devices, several of these devices can be embodied by the same hardware item. The use of the words first, second, and third does not indicate any order. These words can be interpreted as names.

Finally, it should be noted that the above embodiments are only used to illustrate the technical solution of this application, not to limit it; Notwithstanding the detailed description of this application with reference to the foregoing embodiments, ordinary technical personnel in the field shall understand that they may still modify the technical solutions recorded in the foregoing embodiments or make equivalent substitutions for some of their technical features; Such modification or substitution shall not separate the essence of the corresponding technical solution from the spirit and scope of the technical solution of each embodiment of this application.

The invention claimed is:

1. A display module, comprising: a display panel, wherein the display panel comprises an active area and a non-active area surrounding the active area, the non-active area comprises a first bonding area located at at least one side of two opposite sides of the active area;
   the first bonding area at the at least one side is provided with at least one chip group, and a group of first PLG wirings corresponding to each of the chip groups; each of the chip groups comprises at least two groups of chip units, each group of the chip units comprises at least one gate drive chip; each group of the first PLG wirings comprises a first wiring and at least one second wiring, and input ends of the first wiring and each of the second wirings are connected with a same power signal end;
   wherein, power pins of any two adjacent instances of the gate drive chips are connected by the first wiring, and each of the second wirings surrounds and passes through each of the gate drive chips; from a direction close to the power signal end to a direction far away from the power signal end, the first wiring connected with the power pin of the last gate drive chip in the previous group of the chip units and any of the second wirings are parallelly connected with the power pin of the first gate drive chip in the next group of the chip units.

2. The display module according to claim 1, wherein the first bonding area at the at least one side is provided with one of the chip groups and a group of the first PLG wirings; and
   the non-active area further comprises a second bonding area located at either side of the two opposite sides of the active area, a side where the second bonding area located at is adjacent to a side where the first bonding area located at, and the power signal end connected with the first PLG wirings is located at the second bonding area.

3. The display module according to claim 1, wherein the first bonding area at the at least one side is provided with two chip groups and two groups of the first PLG wirings; the non-active area further comprises second bonding areas located at the two opposite sides of the active area, and a side where each of the second bonding areas located at is adjacent to a side where the first bonding area located at; and
   the power signal end connected with a group of the first PLG wirings is located at one of the second bonding areas, and the power signal end connected with the other one group of the first PLG wirings is located at the other one of the second bonding areas.

4. The display module according to claim 3, wherein a power pin of a first edge chip is connected with a power pin of a second edge chip trough a third wiring; or, the power pin of the first edge chip is disposed by disconnecting from the power pin of the second edge chip; and
   the two chip groups are a first chip group and a second chip group, the first edge chip is the gate drive chip of the first chip group closest to the second chip group, and the second edge chip is the gate drive chip of the second chip group closet to the first chip group.

5. The display module according to claim 1, wherein a total quantity of the first wirings and the second wirings comprised by each group of the first PLG wirings is equal to a group quantity of the chip units comprised by each of the chip groups; and
    a quantity of the gate drive chips comprised by each group of the chip units is equal.

6. The display module according to claim 1, wherein each group of the chip units comprises at least two gate drive chips; and in the same chip unit, connecting relationship does not exist between the first wirings and the second wirings.

7. The display module according to claim 2, wherein the first bonding area at the at least one side is further provided with a group of second PLG wirings, the second PLG wirings are located at a side of the chip groups far away from the power signal end, and the second PLG wirings are disposed by disconnecting from the chip groups.

8. The display module according to claim 1, wherein the first bonding area at the at least one side is further provided with first chip on films, each of the gate drive chips is bonded in the first bonding area through the first chip on films, each of the first chip on films is provided with a first connecting line and at least one second connecting line;
    the first wiring is disposed at the position of the gate drive chip by disconnecting, and the first wirings disposed by disconnecting are connected through the first connecting line; and
    the second wirings are disposed at the position of the gate drive chip by disconnecting, and the second wirings disposed by disconnecting are connected through the second connecting lines.

9. The display module according to claim 1, wherein the display panel is an embedded touch display panel, the non-active area further comprises a second bonding area located at at least one side of the two opposite sides of the active area, and a fan-out area located at a side close to the active area of each of the second bonding areas; and the display module further comprises a touch display drive chip located at each of the second bonding areas;
    the active area is provided with a plurality of data lines and a plurality of touch signal lines, the fan-out area is provided with a plurality of display leads and a plurality of touch leads, the touch display drive chip has a plurality of display pins and a plurality of touch pins; one end of each of the display leads is connected with the data line, and the other end of each of the display leads is connected with the display pin; one end of each of the touch leads is connected with the touch signal line, and the other end of each of the touch leads is connected with the touch pin;
    wherein along the row direction of the display panel, a distribution pattern of the display leads and the touch leads in the touch display drive chip is the same as a distribution pattern of the data lines and the touch signal lines in the active area; and the display leads and the touch leads are disposed at the same layer.

10. The display module according to claim 9, wherein the quantity ratio of the touch signal lines and the data lines connected with each of the touch display drive chips is X, X touch pins are disposed between any two adjacent instances of the plurality of display pins, and X is a positive integer.

11. The display module according to claim 9, wherein the quantity of the touch signal lines connected with each of the touch display drive chips is equal to a difference between X times the quantity of the data lines connected with each of the touch display drive chips and Y;
    pins of each of the touch display drive chips are divided into Y/X pin groups; in the same pin group, the first pin and the last pin are both of the display pins, and X touch pins are disposed between two adjacent instances of the plurality of display pins; and a distribution pattern of the pins of each of the pin groups is the same;
    wherein, X, Y and Y/X are positive integers greater than or equal to 1; for the touch signal lines and the data lines connected with each of the touch display drive chips, an absolute value of a difference between a quantity of the touch signal lines and (X+1) times of a quantity of the data lines, and an absolute value of a difference between the quantity of the touch signal lines and (X−1) times of the quantity of the data lines are both greater than the value of Y.

12. The display module according to claim 9, wherein a quantity of the data lines disposed in the active area is N, a quantity of the touch display drive chips disposed in each of the second bonding areas is M, a quantity of the display pins comprised by each of the touch display drive chips is N/M, N and M are both positive even numbers, and N is greater than M.

13. The display module according to claim 9, wherein a quantity of the data lines disposed in the active area is N+1, a quantity of the touch display drive chips disposed in each of the second bonding areas is M;
    the touch display drive chips are divided into two categories, which are first category drive chips and second category drive chips; a quantity of the first category drive chips is M−1, and the display pins comprised by the first category drive chips is N/M; a quantity of the second category drive chips is 1, and the display pins comprised by the second category drive chip are divided into first display pins and second display pins, a quantity of the first display pins is N/M, a quantity of the second display pins is 1; N and M are both positive even numbers, and N is greater than M; and
    the second display pins in the second category drive chips are located in front or behind of all rest pins in the second category drive chips.

14. The display module according to claim 13, wherein the second bonding areas comprised by the non-active area are located at the two opposite sides of the active area, the second bonding areas of the at least one side are further provided with second chip on films, each of the touch display drive chips is bonding in each of the second boding areas through the second chip on films;
    in the second bonding areas on the first side and the second bonding areas on the second side, each of the second category drive chips further comprises a first dummy pin, each of the first category drive chips further comprises two second dummy pins; and
    in the second category drive chips, the first dummy pins and the second display pins are located at both sides of all rest pins; and, the first dummy pins located in the second category drive chips at one side and the second display pins in the second category drive chips at the other side are both connected to the same data line.

15. A display apparatus, comprising the display module according to claim 1.

* * * * *